United States Patent [19]

Kawanishi et al.

[11] Patent Number: 5,022,037
[45] Date of Patent: Jun. 4, 1991

[54] SEMICONDUCTOR LASER DEVICE

[75] Inventors: Hidenori Kawanishi, Nara; Hiroshi Hayashi, Soraku; Taiji Morimoto; Shinji Kaneiwa, both of Nara; Nobuyuki Miyauchi, Yamatokoriyama; Seiki Yano, Kashihara, all of Japan

[73] Assignee: Sharp Kabushiki Kaisha, Japan

[21] Appl. No.: 489,180

[22] Filed: Mar. 8, 1990

[30] Foreign Application Priority Data

Mar. 13, 1989 [JP] Japan .................................. 1-60422

[51] Int. Cl.$^5$ .............................................. H01S 3/19
[52] U.S. Cl. .................................................... 372/49
[58] Field of Search ............................ 372/49, 44, 45

[56] References Cited

FOREIGN PATENT DOCUMENTS 0027474 7/1980 Japan ..................................... 372/49
0170585 10/1982 Japan ..................................... 372/49
0113983 6/1985 Japan ..................................... 372/49

OTHER PUBLICATIONS

Journal of Applied Physics, vol. 46, No. 8, Aug. 1975, pp. 3542-3546, M. Konagi et al., "Graded-band-gap . . . Heterojunction Solar Cells".

Primary Examiner—James W. Davie
Attorney, Agent, or Firm—Nixon & Vanderhye

[57] ABSTRACT

A semiconductor laser device is disclosed which emits laser light from an end facet. The semiconductor laser device comprises a multi-layered structure formed on a semiconductor substrate, the multi-layered structure having an active layer for laser oscillation, and a pair of cleavage planes on the side of the multi-layered structure, wherein a graded-band-gap layer is formed on at least one of the cleavage planes, the graded-band-gap layer having a forbidden band gap which increases gradually with an increase in the distance from the cleavage plane, and the surface of the graded-band-gap layer constituting the end facet.

7 Claims, 8 Drawing Sheets

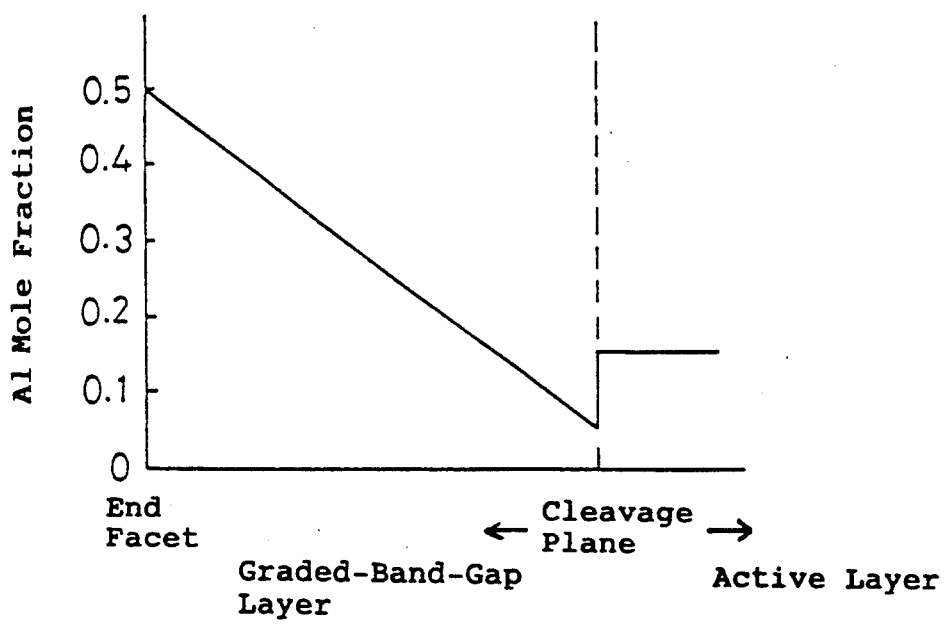

SEMICONDUCTOR LASER DEVICE

BACKGROUND OF THE INVENTION

1. Field of the invention:

This invention relates to a semiconductor laser device which emits laser light from an end facet thereof and it also relates to a method for the production of such a semiconductor laser device.

2. Description of the prior art:

In recent years, semiconductor laser devices have widely come into practical use as light sources for optical disc driving units. When semiconductor laser devices are used as the light source for write-once optical disc driving units or rewritable optical disc driving units, they are required to have high reliability even at a high output power level of from 40 to 50 mW. When used as the light source for optical pumping of solid-state laser devices such as a YAG laser, an output power of 100 mW or more is required.

However, it has been reported that the reliability of the semiconductor laser devices in practical use today, which can attain laser oscillation at a relatively high output power level, is inversely proportional to the optical output power raised to the fourth power, when the devices of the same construction are compared. In other words, it is extremely difficult to raise the optical output power, while maintaining high reliability.

The principal cause for deterioration of semiconductor laser devices in high output power operation is facet deterioration. This is because heat is generated locally at the light-emitting facet due to the high optical density at this facet. The mechanism of this heat generation will be explained by reference to FIGS. 5a–5b and 6a–6b.

FIGS. 5a and 5b are schematic diagrams showing the energy band structures near the surface originating from the surface state which occurs when either the n-type or p-type GaAs (110)-surface is slightly oxidized. In the case of either n-type or p-type GaAs, numerous carriers accumulate near the surface to form a so-called "accumulation layer" which is indicated by reference numeral 1 in these figures.

In general, it is well known that the surface state will bend the energy bands near the surface. In addition to the accumulation layer 1 shown in FIGS. 5a and 5b, minority carriers may gather near the surface and majority carriers be distanced from the surface as shown in FIGS. 6a and 6b, resulting in the formation of an inversion layer 2 which is a local inversion of the conductivity type. Whether an accumulation layer 1, or an inversion layer 2 forms, is dependent on the height relationship between the surface state $E_s$ and the Fermi level $E_f$ of the semiconductor. In either case of n-type or p-type GaAs, an accumulation layer 1 will form.

The electrons and positive holes trapped in the surface state $E_s$ are released after a short relaxation time, and this energy is released as heat. Electrons and positive holes are then again trapped in the surface state which has become a vacant state, and the above process is repeated, so that heat continues to be released.

While the above process is being repeated, the heat released from the surface state concentrates at the end facets of the semiconductor, and this heat narrows the forbidden band gap in the energy bands. Furthermore, the absorption of light increases the minority carriers, and heat generation further increases by way of the surface state. This process raises the temperature of the semiconductor surface, which may reach the melting point of the semiconductor, resulting in facet breakdown.

In the case of GaAs, an accumulation layer forms, while in the case of other materials such as AlGaAs, an inversion layer may form. In the latter case, majority carriers are trapped in the surface state, and facet breakdown occurs by the same process as that by an accumulation layer. In the case of semiconductor laser devices used under a high injection condition, heat generation originating with the surface state becomes a more serious problem.

As a method for preventing the effect of surface recombination, there has been proposed a method in which a region having a graded band gap is formed near the surface. For example, a solar cell having a graded-band-gap layer formed by liquid phase epitaxy is disclosed by M. Konagai and K. Takahashi, J. Appl. Phys. Vol. 46 No. 8, pp. 3542–3546 August (1975).

FIG. 7 shows a schematic energy band diagram of a graded-band-gap heterojunction solar cell described in the above-identified prior art reference. As can be seen from this figure, among carriers generated by the absorption of light, electrons are drawn strongly into the inside of semiconductor crystals due to the drift caused by the grading of the energy gap, as well as the migration usually caused by the diffusion. This results in a reduced probability IO that these electrons will be trapped in the surface state, and therefore, surface recombination can be effectively suppressed.

In the case of solar cells, because the crystal surface functions as a light-receiving facet, a graded-band-gap layer can be formed by liquid phase epitaxy during the crystal growth, thereby attaining the effective suppression of surface recombination.

However, in the case of semiconductor laser devices, a light-emitting facet, which may be adversely affected by surface recombination, is usually formed by a cleavage of semiconductor crystals. Therefore, it is extremely difficult to form a graded-band-gap layer in advance on the cleavage plane by liquid phase epitaxy. For this reason, conventional semiconductor laser devices have a serious problem of causing facet breakdown due to surface recombination at the light-emitting facet.

SUMMARY OF THE INVENTION

The semiconductor laser device of this invention, which overcomes the above-discussed and numerous other disadvantages and deficiencies of the prior art, comprises a multi-layered structure formed on a semiconductor substrate, the multi-layered structure having an active layer for laser oscillation, and a pair of cleavage planes on the side of the multi-layered structure, the device wherein a graded-band-gap layer is formed on at least one of the cleavage planes, the graded-band-gap layer having a forbidden band gap which increases gradually with an increase in the distance from the cleavage plane, and the surface of the graded-band-gap layer constituting an end facet of the device.

In a preferred embodiment, the active layer is made of $Ga_{1-x}Al_xAs$ ($0 \leq x \leq 1$) and the graded-band-gap layer is made of $Ga_{1-y}Al_yAs$.

In a more preferred embodiment, the Al mole fraction y of the graded-band-gap layer increases from the cleavage plane to the end facet in accordance with the linear or parabolic distribution.

In another more preferred embodiment, the above-mentioned Al mole fraction y at the cleavage plane between the active layer and the graded-band-gap layer is equal to the Al mole fraction x.

In still another more preferred embodiment, the above-mentioned Al mole fraction y at the cleavage plane between the active layer and the graded-band-gap layer is greater than the Al mole fraction x.

In still another more preferred embodiment, the above-mentioned Al mole fraction y at the cleavage plane between the active layer and the graded-band-gap layer is smaller than the Al mole fraction x.

The method of this invention for the production of a semiconductor laser device as mentioned above, comprises forming a multi-layered structure on a semiconductor substrate, the multi-layered structure having an active layer for laser oscillation; cleaving the substrate together with the multi-layered structure to form a laser cavity between cleavage planes; and forming a graded-band-gap layer on at least one of the cleavage planes, the graded-band-gap layer having a forbidden band gap which increases gradually with an increase in the distance from the cleavage plane.

In a preferred embodiment, the graded-band-gap layer is grown by vapor phase epitaxy.

Thus, the invention described herein makes possible the objectives of (1) providing a semiconductor laser device with a construction capable of suppressing the surface state in the vicinity of the light-emitting facet so that facet breakdown does not occur easily even in high output power conditions; (2) providing a semiconductor laser device in which a graded-band-gap layer is formed on the cleavage plane, and therefore, electrons generated near the end facet are rapidly separated from the end facet, so that facet breakdown due to surface recombination can be effectively suppressed, thereby attaining the improved output power with high reliability; and (3) providing a method for the production of such a semiconductor laser device with excellent characteristics.

DESCRIPTION OF THE DRAWINGS

This invention may be better understood and its numerous objects and advantages will become apparent to those skilled in the art by reference to the accompanying drawings as follows:

FIGS. 3a–3c are diagrams showing various distributions of an Al mole fraction in the graded-band-gap layer and the active layer of semiconductor laser devices of this invention.

FIG. 4 is a graph showing the injected current-optical output characteristics of the semiconductor laser device of this invention wherein the graded-band-gap layer has an Al mole fraction as shown in FIG. 3a.

DESCRIPTION OF THE PREFERRED EMBODIMENTS

The semiconductor laser device of this invention has the same structure as that of a conventional semiconductor laser device which emits laser light from an end facet thereof, except that a graded-band-gap layer is formed on at least one of the cleavage planes. The graded-band-gap layer has a forbidden band gap which increases gradually with an increase in the distance from the cleavage plane. The surface of the graded-band-gap layer constitutes the end facet of the device.

Figure 1:
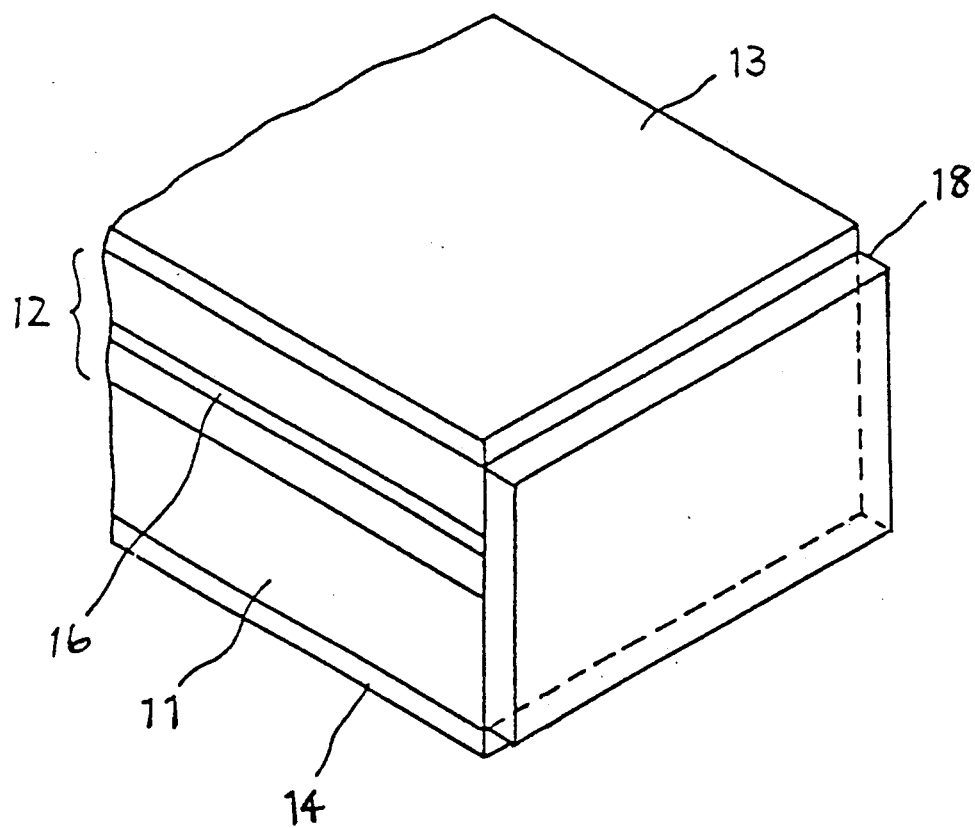
FIG. 1 is a perspective view showing the front facet area of a semiconductor laser device of this invention.

FIG. 1 is a perspective view showing the front facet area of a semiconductor laser device of this invention. The production process of this semiconductor laser device is explained below.

Figure 2A:
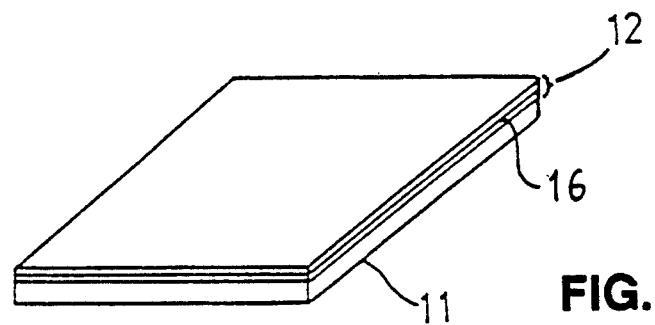
FIGS. 2a–2c are perspective views showing the production of the semiconductor laser device of FIG. 1.

First, as shown in FIG. 2a, a multi-layered structure 12 including an active layer 16 for laser oscillation is grown on a semiconductor substrate 11. The active layer 16 is made of, for example, $Ga_{1-x}Al_xAs$ ($0 \leq x \leq 1$). The method for the growth of the multilayered structure 12 including the active layer 16 can be any one of the conventional processes such as liquid phase epitaxy and vapor phase epitaxy.

Figure 2B:
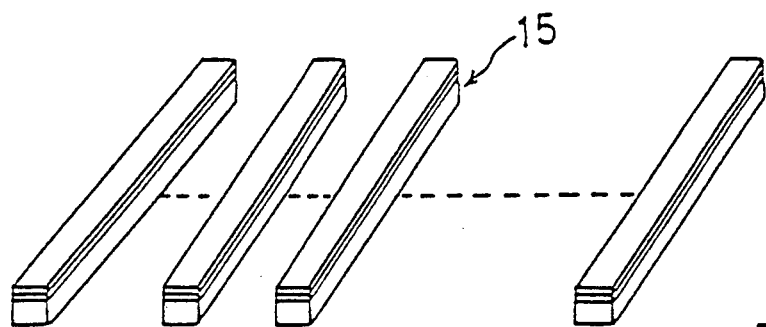
Figure 2C:
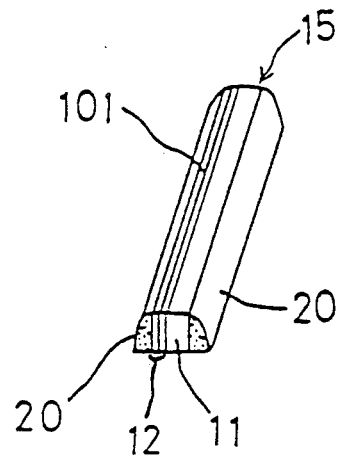

Next, the wafer thus obtained is cleaved by a known cleavage method so as to obtain the prescribed cavity length, resulting in a plurality of bars 15 as shown in FIG. 2b. Each of the bars 15 has a plurality of cavity units arranged in the direction perpendicular to the cavity direction. After cleaving, on the planes of the bar 15 other than the cleavage planes 101, as $SiO_2$ film 20 is formed by plasma chemical vapor deposition or other similar processes as shown in FIG. 2c.

Then, on at least one of the cleavage planes 101, a graded-band-gap layer 18 is formed by molecular beam epitaxy or metal organic chemical vapor deposition. When the active layer 16 is made of $Ga_{1-x}Al_xAs$ ($0 \leq x \leq 1$) the graded-band-gap layer 18 is also made of $Ga_{1-y}Al_yAs$ in which the Al mole fraction y increases gradually from the Al mole fraction x of the active layer 16 to the prescribed final value at the end facet. (Those in the art will realize that the mole fraction y is also within the range $0 \leq y \leq 1$ in accordance with conventional notation.) In this case, the GaAlAs layer grown on the $SiO_2$ film 20 is made of polycrystallines, and such a polycrystalline GaAlAs layer can readily be removed by an etching technique after growth. Accordingly, the graded-band-gap layer 18 can be formed only on the cleavage plane which corresponds to the light-emitting facet of the laser cavity.

Thereafter, the $SiO_2$ film 20 is removed, and ohmic electrodes 13 and 14 were formed on the upper face of the multi-layered structure 12 and the back face of the semiconductor substrate 11, respectively. The method for the formation of the ohmic electrodes 13 and 14 can be any one of the conventional processes.

Alternatively, after the multi-layered structure 12 including the active layer 16 is formed on the semiconductor substrate 11, an $SiO_2$ film may be formed on the upper face of the multi-layered structure 12 and the back face of the semiconductor substrate 11, followed by cleavage of the wafer thus obtained. In this case, the cleavage of the wafer can immediately provide a bar 15 as shown in FIG. 2c.

Figure 3A:
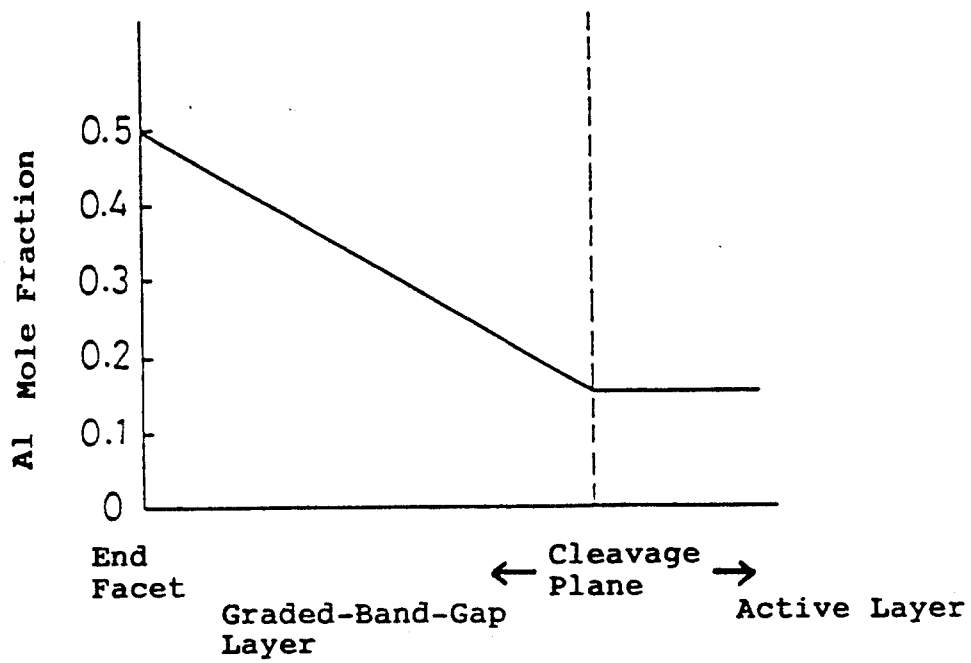

As a practical example, a semiconductor laser device was produced with the above-mentioned constitution, in which the Al mole fraction x of the active layer 16 was set to 0.14 and the Al mole fraction y of the graded-band-gap layer 18 was varied as shown in FIG. 3a. The thickness of the graded-band-gap layer 18 was 0.1 μm.

The semiconductor laser device thus obtained was then provided with coatings on both end facets such that the reflectivity of the light-emitting facet became 4% and the reflectivity of the other facet 95%.

For comparison, a conventional semiconductor laser device was produced in the same way as mentioned above, except that no graded-band-gap layer was formed on the cleavage planes.

Figure 4:
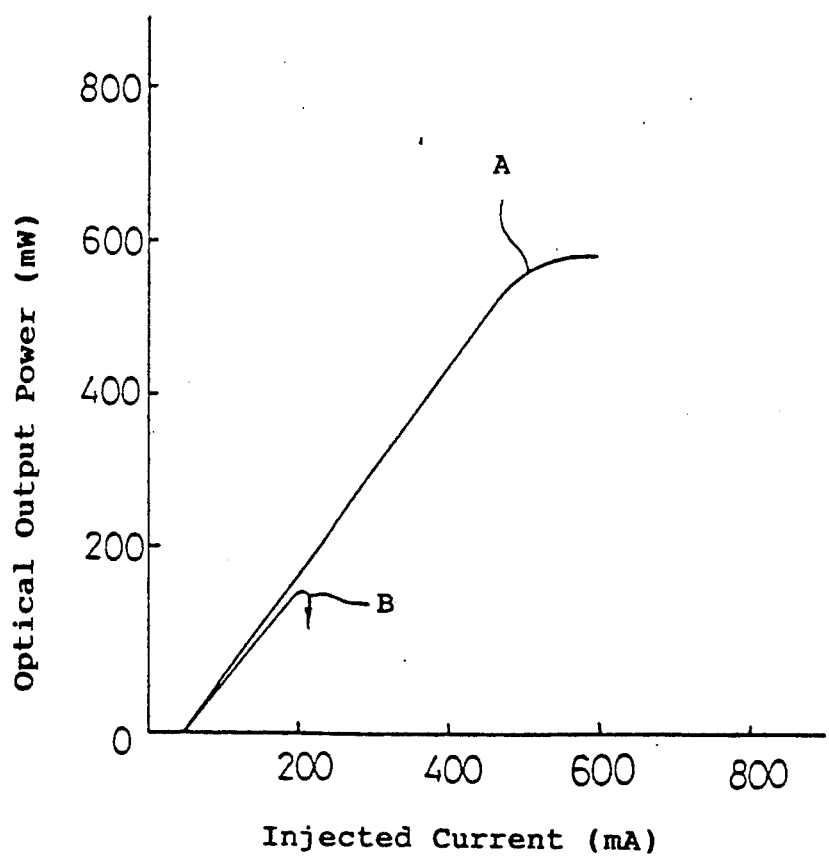
Figure 5A:
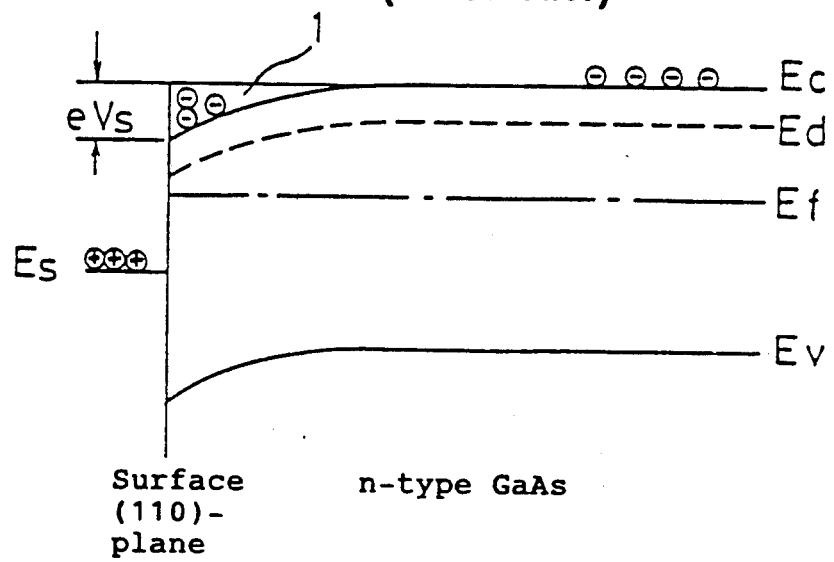
FIGS. 5a and 5b are schematic energy band diagrams showing the formation of a carrier accumulation layer in the surface area of n-type and p-type GaAs, respectively.
Figure 5B:
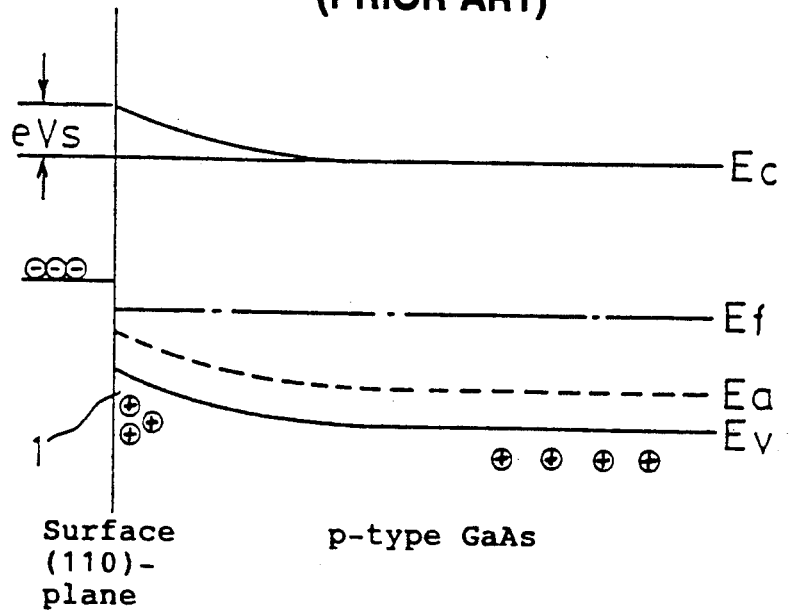
Figure 6A:
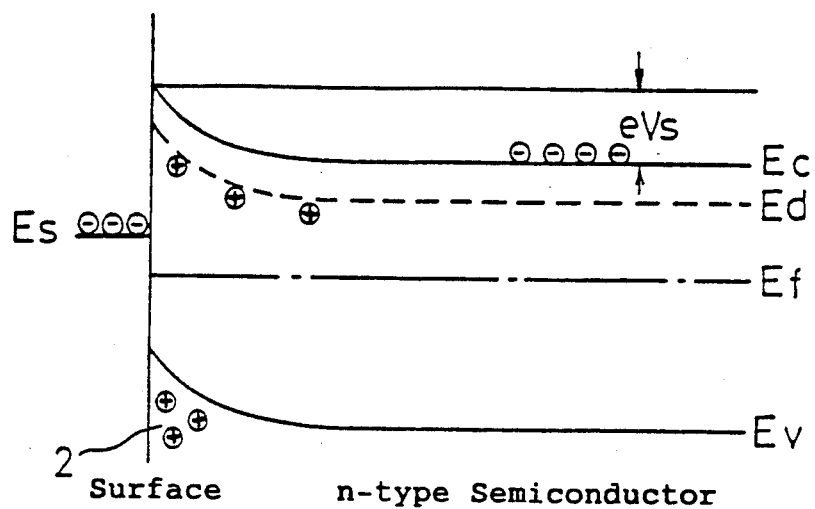
FIGS. 6a and 6b are schematic energy band diagrams showing the formation of an inversion layer in the surface area of n-type and p-type semiconductors, respectively.
Figure 6B:
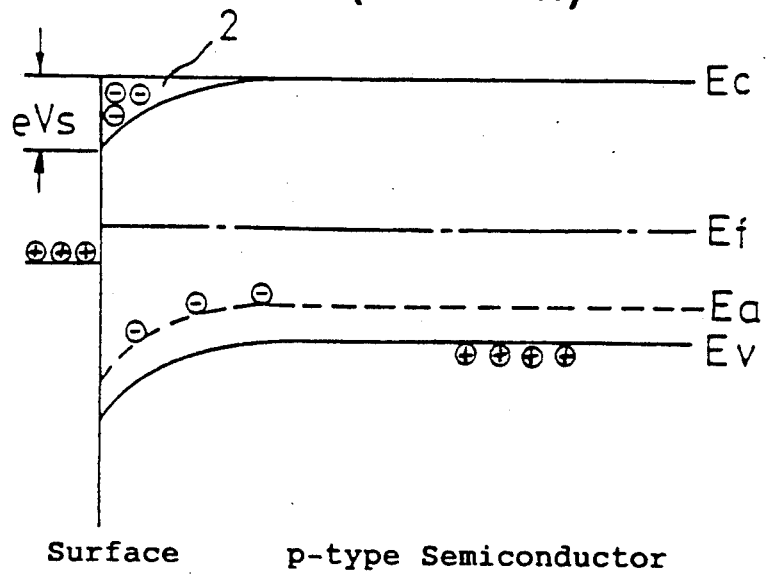
Figure 7:
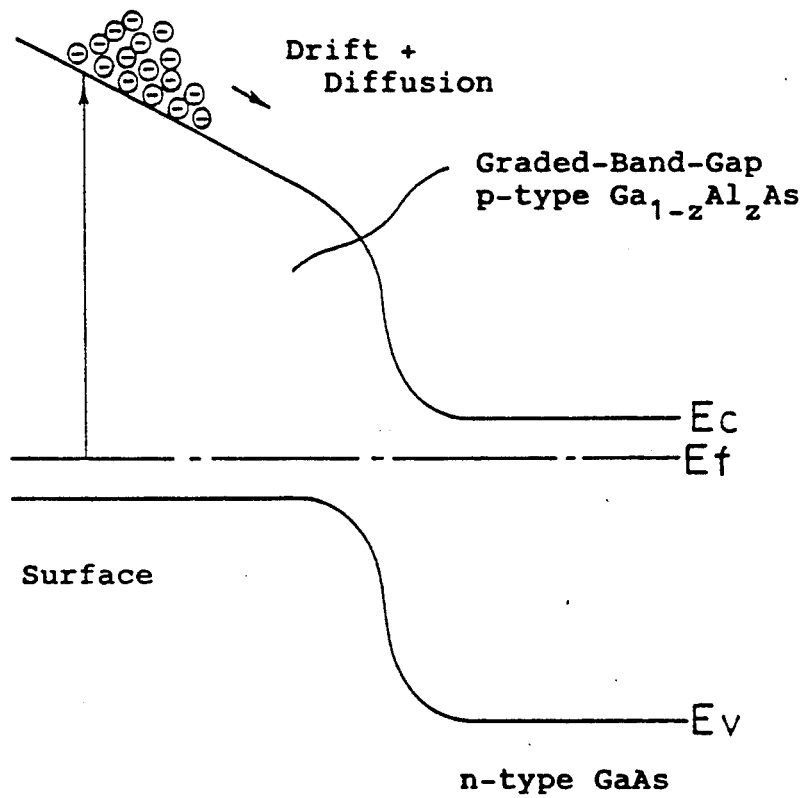
FIG. 7 is a schematic energy band diagram of a conventional solar cell with a heterojunction composed of p-type graded-band-gap $Ga_{1-z}Al_zAs$ and n-type GaAs.

FIG. 4 is a graph showing the injected current-optical output characteristics of the semiconductor laser device of this example obtained above (curve A) and the conventional semiconductor laser device obtained above (curve B). As can be seen from this figure, in the conventional semiconductor laser device, deterioration of the device characteristics occurs due to facet breakdown at an optical output power of approximately 200 mW, whereas the semiconductor laser device of this example can attain stable laser oscillation even at an optical output power of up to about 600 mW without causing facet breakdown.

Figure 3B:
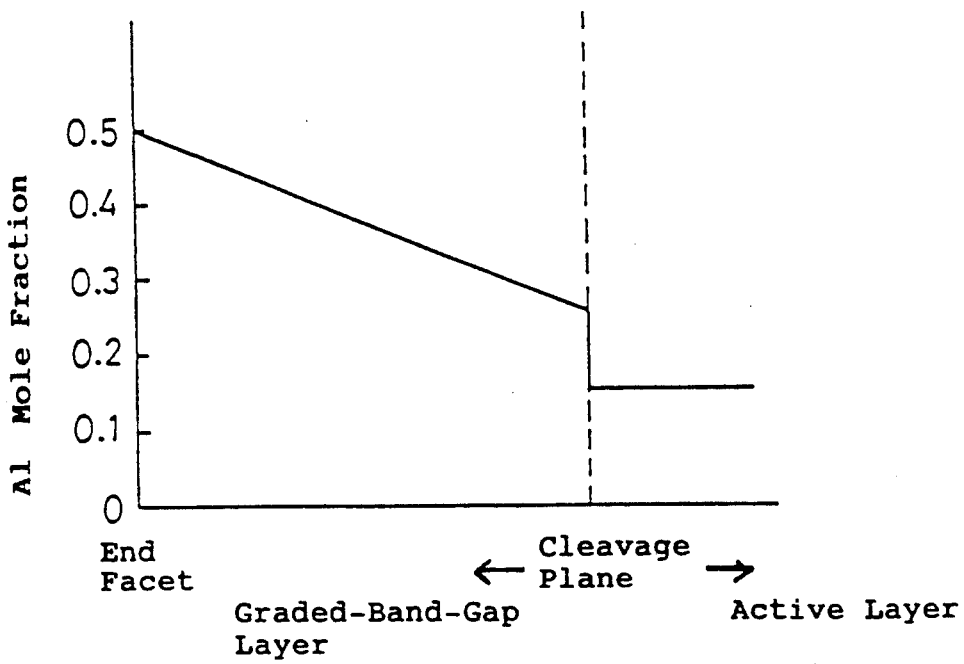

Although in the above example, the Al mole fraction y of the graded-band-gap layer was varied in accordance with the linear distribution as shown in FIG. 3a, it may also be varied in accordance with the parabolic distribution. Moreover, the Al mole fraction y is not limited to the final value of 0.5 as shown in FIG. 3a, but it can takes any final value so long as it increases gradually with an increase in the distance from the cleavage plane. Furthermore, as shown in FIG. 3b, there may exist a step of the Al mole fraction at the cleavage plane between the active layer and the graded-band-gap layer, that is, the Al mole fraction y of the graded-band-gap layer at the cleavage plane may be greater than the Al mole fraction x of the active layer. Alternatively, as shown in FIG. 3c, there may exist a barrier against electrons at the cleavage plane, that is, the Al mole fraction y of the graded-band-gap layer at the cleavage plane may be smaller than the Al mole fraction x of the active layer. In any case, excellent device characteristics as mentioned above could be obtained by the formation of such a graded-band-gap layer on the cleavage plane.

In general, besides the carriers generated by the absorption of light, semiconductor laser devices contain additional carriers injected in the active layer from the outside. Therefore, the active layer has a high density of carriers. In the semiconductor laser device of this invention, carriers present in the vicinity of the light-emitting facet can be rapidly separated from the end facet due to the drift as well as the diffusion, resulting in an extremely small probability that these electrons contribute to heat generation via the surface state. Therefore, deterioration of the end facets can be effectively suppressed and the semiconductor laser device of this invention can attain stable laser oscillation at high output power for a long period of time.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device which emits laser light from an end facet, comprising:
   a multi-layered structure formed on a semiconductor substrate,
   said multi-layered structure having an active layer for laser oscillation, and a pair of cleavage planes,
   a graded-band-gap layer formed on at least one of said cleavage planes,
   said graded-band-gap layer having a forbidden band gap which increases gradually with an increase in distance form said cleavage plane, and
   the surface of said graded-band-gap layer constituting said end facet.

2. A semiconductor laser device according to claim 1, wherein said active layer is made of $Ga_{1-x}Al_xAs$ ($0 \leq x \leq 1$) and said graded-band gap layer is made of $Ga_{1-y}Al_yAs$ ($0 \leq y \leq 1$).

3. A semiconductor laser device according to claim 2, wherein the Al mole fraction y of said graded-band-gap layer increases form the cleavage plane to the end facet in accordance with a linear or parabolic distribution.

4. A semiconductor laser device according to claim 3, wherein the Al mole fraction y at the cleavage plane between the active layer and the graded-band-gap layer is approximately equal to the Al mole fraction x.

5. A semiconductor laser device according to claim 3, wherein the Al mole fraction y at the cleavage plane between the active layer and the graded-band-gap layer is greater than the Al mole fraction x.

6. A semiconductor laser device according to claim 3, wherein the Al mole fraction y at the cleavage plane between the active layer and the graded-band-gap layer is smaller than the Al mole fraction x.

7. A semiconductor laser comprising a cleaved end laser cavity and a light emitting facet thereat including a graded-band-gap semiconductor layer located between the cleaved end laser cavity and said light emitting facet, said graded-band-gap semiconductor layer having a forbidden band gap which increases with an increase in distance from said cleaved end towards said light emitting fact of said layer.

* * * * *